(12) United States Patent
Niizuma

(10) Patent No.: US 8,074,867 B2
(45) Date of Patent: Dec. 13, 2011

(54) CONDUCTIVE BALL MOUNTING APPARATUS

(75) Inventor: Kazuo Niizuma, Ishikawa (JP)

(73) Assignee: Shibuya Kogyo Co., Ltd., Ishikawa (JP)

( * ) Notice: Subject to any disclaimer, the term of this patent is extended or adjusted under 35 U.S.C. 154(b) by 0 days.

(21) Appl. No.: 12/695,560

(22) Filed: Jan. 28, 2010

(65) Prior Publication Data

US 2010/0127048 A1    May 27, 2010

Related U.S. Application Data

(62) Division of application No. 11/411,037, filed on Apr. 26, 2006, now abandoned.

(30) Foreign Application Priority Data

Apr. 28, 2005   (JP) .................................. 2005-132062

(51) Int. Cl.
    *B23K 35/04*   (2006.01)
(52) U.S. Cl. ................ 228/175; 228/179.1; 228/180.22; 228/245
(58) Field of Classification Search .................. 228/178, 228/179.1, 180.1, 180.21, 180.22, 6.1, 6.2, 228/4.1
    See application file for complete search history.

(56) References Cited

U.S. PATENT DOCUMENTS

| | | | |
|---|---|---|---|
| 4,893,536 A | 1/1990 | Kinoshita | |
| 5,431,332 A | 7/1995 | Kirby et al. | |
| 5,655,704 A | 8/1997 | Sakemi et al. | |
| 6,253,992 B1 | 7/2001 | Fjelstad | |
| 6,270,002 B1 | 8/2001 | Hayashi et al. | |
| 6,402,014 B1 | 6/2002 | Inoue et al. | |
| 6,533,160 B1 | 3/2003 | Bourrieres et al. | |
| 6,595,404 B2 * | 7/2003 | Suzuki et al. | 228/175 |
| 2002/0058406 A1 | 5/2002 | Mukuno et al. | |
| 2004/0134363 A1 | 7/2004 | Saiki et al. | |
| 2005/0056682 A1 | 3/2005 | Cobbley et al. | |

FOREIGN PATENT DOCUMENTS

| | | |
|---|---|---|
| FR | 2798309 A1 | 3/2001 |
| GB | 2425502 A | 11/2006 |
| JP | 05-129374 A | 5/1993 |
| JP | 11297886 A | 10/1999 |
| JP | 3177370 B2 | 4/2001 |
| JP | 2001358451 A | 12/2001 |
| JP | 2002538970 A | 11/2002 |
| JP | 2004-253770 A | 9/2004 |

OTHER PUBLICATIONS

Japanese Office Action dated Jan. 12, 2010 in Japanese Application No. 2005-132062.

* cited by examiner

*Primary Examiner* — David Sample
*Assistant Examiner* — Megha Mehta
(74) *Attorney, Agent, or Firm* — Sughrue Mion, PLLC

(57) ABSTRACT

A conductive ball mounting apparatus for mounting conductive balls by providing an array mask having through holes, into which conductive balls are to enter, above a mounting target placed on a stage, by arranging a ball reservoir having an opening for reserving a plurality of conductive balls, in the bottom, by moving the ball reservoir along the array mask, by dropping the conductive balls into the individual through holes of the array mask, adopts the following means. Firstly, the conductive ball mounting apparatus comprises moving means for moving the array mask and the stage relative to each other in horizontal directions. Secondly, the positions of the conductive balls in the through holes are arranged by finely moving at least one of the array mask and the stage relative to each other in the horizontal directions after the balls were dropped.

2 Claims, 6 Drawing Sheets

CONDUCTIVE BALL MOUNTING APPARATUS

This is a divisional of U.S. application Ser. No. 11/411,037, filed Apr. 26, 2006, which claims priority to Japanese Patent Application No. 2005-132062, filed Apr. 28, 2005, respectively. The entire disclosures are hereby incorporated by reference.

BACKGROUND OF THE INVENTION

1. Field of the Invention

The present invention relates to an improvement in an apparatus for mounting a number of conductive balls by moving a ball reservoir for reserving the conductive balls along the upper face of an array mask and, more particularly, to a conductive ball mounting apparatus which is improved with a main view to improving the positional precision of the conductive balls in the through holes of the array mask.

2. Description of the Related Art

As the conductive ball mounting apparatus for mounting conductive balls after the adhesive material was applied to individual electrodes formed in a predetermined array pattern on the mounting target, there exists in the related art an apparatus for mounting the conductive balls, after sucked, arrayed and adsorbed by the ball mounting head having an array plate, on the individual electrodes on the mounting target, as disclosed in JP-A-2001-358451. However, as the mounting target product such as a wafer becomes larger, the number of solder balls to be mounted at one time exceeds one million. This makes it difficult at present to reduce the defects in the array of solder balls and the defects at the mounting time.

As disclosed in JP-A-2002-538970 and Japanese Patent No. 3177370, therefore, there has been provided an apparatus, in which an electronic substrate or a mounting target printed with flux is provided with an array mask and in which solder balls are directly dropped onto electrodes of the electronic substrate. As compared with the diameter of the conductive balls, however, the diameter of the through holes of the array mask is larger. This raises a problem that the positions of the conductive balls in the through holes are not arranged merely by dropping the conductive balls into the through holes of the array mask.

SUMMARY OF THE INVENTION

The present invention has an object to solve the aforementioned problem and to provide a conductive ball mounting apparatus which is enabled by arranging the positions of conductive balls in through holes to improve the precision even in positions for mounting a large number of conductive balls.

In order to solve the aforementioned problem, a first aspect of the invention adopts the following means in the conductive ball mounting apparatus for mounting a conductive ball comprising an array mask having a through hole, into which a conductive ball is to enter, the array mask being provided above a mounting target placed on a stage, a ball reservoir having an opening for reserving a plurality of conductive balls in the bottom thereof, the ball reservoir moving along the array mask and dropping the conductive balls into the through hole of the array mask, adopts the following means.

Firstly, the conductive ball mounting apparatus comprises moving means for moving at least one of the array mask and the stage relative to each other in a horizontal direction.

Secondly, a position of the conductive ball in the through hole is arranged by moving at least one of the array mask and the stage relative to each other in a horizontal direction after the balls was dropped.

According to a second aspect of the invention, the moving at least one of the array mask and the stage comprises a straight movement in a horizontal direction. According to a third aspect of the invention, the moving at least on of the array mask and the stage further comprises a sequential movement in a direction perpendicular to the horizontal directions. According to a fifth aspect of the invention, the moving at least one of the array mask and the stage comprises a movement to turn in a horizontal plane.

According to a fourth aspect of the invention, a distance of the moving at least one of the array mask and the stage is at least a difference between a diameter of the conductive ball and a diameter of the through hole. According to a sixth aspect of the invention, after the moving at least one of the array mask and the stage, the at least one of the array mask and the stage is so moved that the conductive ball leaves the inner wall of the through hole.

In the first aspect of the invention, the positions of the conductive balls in the through holes are arranged by finely moving the array mask and the stage relative to each other in the horizontal directions after the balls were dropped. As a result, the conductive ball mounting apparatus can improve the positioning precision for mounting the conductive balls. Moreover, the apparatus mounts the conductive balls in position by arranging the array mask having the through holes for dropping the conductive balls, above the mounting target, and by moving the ball reservoir to reserve the numerous conductive balls, by the ball reservoir moving means, along the array mask. As a result, the apparatus can precisely mount the numerous conductive balls, the number of which increases as the mounting target products such as wafers are large-sized.

In the second, third or fifth aspect of the invention, the fine movements of the array mask and the stage are straight movements in one direction of horizontal directions, sequential movements in two directions perpendicular in the horizontal directions, or movements to turn in a horizontal plane. Even at less steps or by smaller actions, it is possible to improve the mounting position precision of the conductive balls better. In the fourth aspect of the invention, moreover, the fine moving distances of the array mask and the stage in one direction are at least the difference between the conductive ball diameter and the through hole diameter. In the sixth aspect of the invention, the array mask and the stage are finely moved relative to each other and are then so moved that the conductive balls may leave the inner walls of the through holes. As a result, it is possible to improve the mounting position precision of the conductive balls better.

DETAILED DESCRIPTION OF THE PREFERRED EMBODIMENTS

An embodiment of the invention is described in the following with reference to the accompanying drawings. In the invention, a semiconductor wafer (as will be simplified into the wafer), an electronic circuit substrate or a ceramic substrate is exemplified as a target for mounting conductive balls, but a wafer 14 is used in the embodiment. Moreover, electrodes 38 are formed in a predetermined pattern on the surface of the mounting target. On the other hand, flux, solder paste or a conductive adhesive is used as an adhesive material.

Figure 1:
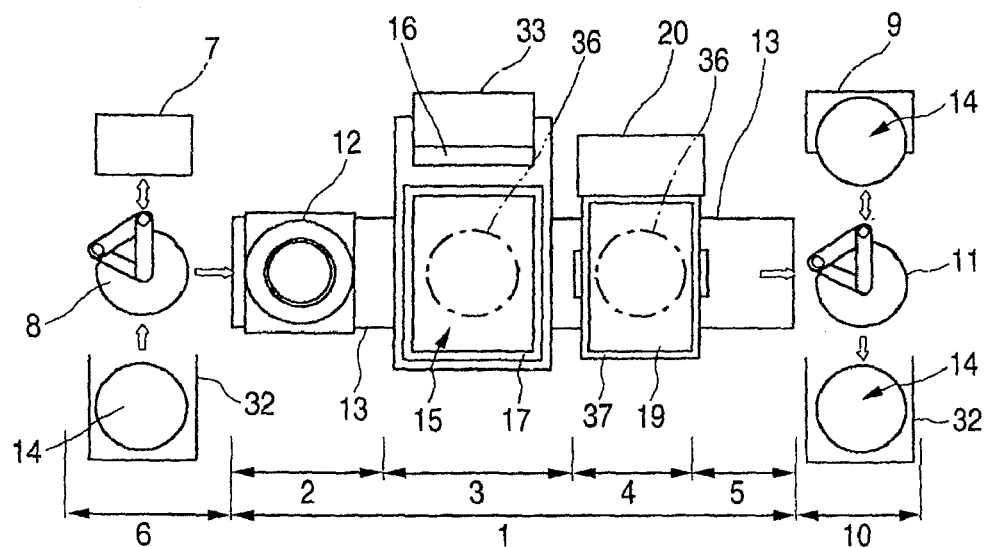
FIG. 1 is a schematic top plan view showing the entirety of a solder ball mounting apparatus according to the embodiment.

FIG. 1 is a schematic top plan view showing the entirety of a solder ball mounting apparatus 1. This solder ball mounting apparatus 1 includes a carry-in wafer transfer unit 2, a flux printing unit 3, a ball mounting unit 4, and a carry-out wafer transfer unit 5. A wafer feeding unit 6, a primary alignment unit 7 and a carry-in robot 8 exist at the pre-step of the solder ball mounting apparatus 1, and an inversion unit 9, a wafer housing unit 10 and a carry-out robot 11 exist at the post-step of the solder ball mounting apparatus 1.

The primary alignment unit 7 for the pre-step turns the wafer 14 in a horizontal plane to detect the position of an orientation flat or notch of the wafer 14 thereby to correct the position of the wafer 14 approximately and to direct the wafer 14 to be mounted on the wafer transfer unit 2, in a predetermined direction. On the other hand, the inversion unit 9 for the post-step turns the wafer 14 in the horizontal direction so that the wafer 14 is turned to bring its orientation flat or notch to a predetermined position and is housed in a magazine 32.

The solder ball mounting apparatus 1 is equipped with a wafer transfer stage 12 and a transfer passage 13 for transferring the wafer 14 from the wafer transfer unit to the flux printing unit 3, the ball mounting unit 4 and the wafer transfer unit 5. The transfer passage 13 is equipped with an X-axis (longitudinal, as shown) drive mechanism 40 of the transfer stage 12.

The flux printing unit 3 is equipped with a flux feeding device 16, a printing mask 15 for printing flux or the adhesive material on the wafer 14, and vertical observation cameras 31 for observing the alignment marks of the wafer 14 and the printing mask 15 thereby to register the wafer 14 and the printing mask 15. The printing mask 15 has through holes formed along with the pattern of the electrodes 38 on the wafer 14. Two (not-shown) alignment marks are formed at two portions on the lower face of the printing mask 15 in a through hole forming area 36. The printing mask 15 is applied to a molding box 17 and is held by a fixing unit such as a frame. The flux feeding device 16 moves the (not-shown) squeezee along the upper face of the printing mask 15 so that the flux is printed in the through holes of the printing mask 15 and fed onto the electrodes 38 of the wafer 14. Here, numeral 33 in the drawing designates a cleaning unit for cleaning off the flux adhered to the printing mask 15.

The ball mounting unit 4 is equipped with a solder ball feeding device 20, a ball array mask 19 having through holes 18 formed along with the pattern of the electrodes 38 on the wafer 14, and vertical observation cameras 34 for observing the alignment marks of the wafer 14 and the ball array mask 19 thereby to register them.

The ball array mask 19 has a thickness substantially equal to the diameter of solder balls 21 to be fed, and the through holes 18 have a diameter slightly larger than that of the solder balls. Like the printing mask 15, the ball array mask 19 has the (not-shown) alignment marks formed at two portions on the lower face of the through hole forming area 36. The ball array mask 19 is adhered to a molding box 37 and is held by a fixing unit such as the frame.

The solder ball feeding device 20 is equipped with a ball hopper 22 for reserving a number of solder balls 21, a ball cup 23 for dropping the solder balls 21 into the ball array mask 19, a mask height detecting sensor 27, and a carriage unit 24 not only for moving the ball cups 23 along an X-axis guide 25 and a Y-axis guide 26 but also for displacing the same in a Z-axis direction. Here, the ball hopper 22 is exchanged according to the size and material of the solder balls 21. Inside of and in the lower portion of the inner wall face of the ball cup 23, there is formed a recess 35 for causing the solder balls 21 housed therein to circulate, as indicated by an arrow in the ball cup 23 in FIG. 3.

The mask height detecting sensor 27 may be of either the contact type or the non-contact type. Specifically, a laser sensor or an electrostatic capacity sensor is used as the mask height detecting sensor 27. The mask height detection is made by bringing the molding box 37 of the ball array mask 19, when exchanged at an initial setting time or at a mold exchanging time, into abutment against a stopper or the like, and by positioning and fixing the molding box 37 by means of a clamp. Specifically, after the ball array mask 19 was fixed, the ball cup 23 empty of the solder balls 21 is moved sequentially on a plurality of height detection points preset outside of the through hole forming area 36, and the height of the upper face of the ball array mask 19 is measured.

On the other hand, the height of the upper face of the ball array mask 19 in the through hole forming area 36 is determined by calculations. Moreover, the heights at the individual positions are calculated by considering the weight which is applied when the solder balls 21 are housed in the ball cup 23. At the ball mounting time, the ball cup 23 is so moved on the basis of the determined height, while being controlled by the moving unit 24, that the clearance between the upper face of the ball array mask 19 and the lower face of the ball cup 23 may not exceed a predetermined distance.

The wafer transfer stage 12 is a stage for placing the wafer 14 thereon and is mounted on the X-axis drive mechanism 40 through a Y-axis drive mechanism 28 acting as moving means in the direction (i.e., the Y-axis direction) perpendicular to the transfer passage 13 of the wafer 14, a θ-axis drive mechanism 29 acting as turning means, and a Z-axis drive mechanism 30 acting as vertically moving means.

The actions of the solder ball mounting apparatus 1 of the embodiment are described. At first, the wafer 14 to have the solder balls 21 mounted thereon is housed in the magazine 32 of the wafer feeding unit 6. Then, one wafer 14 is extracted from the magazine 32 of the wafer feeding unit 6 and carried in the primary alignment unit 7. In this primary alignment unit 7, the wafer 14 is turned to detect the position of the orientation flat or notch thereby to correct the position of the wafer 14 approximately and to set the orientation flat or notch at a predetermined position. Subsequently, the wafer 14 is carried by the carry-in robot 8 from the primary alignment unit 7 to the wafer transfer stage 12 on standby at the wafer transfer unit 2.

The wafer transfer stage 12 having the wafer 14 mounted thereon is moved by the X-axis drive mechanism 40 along the transfer passage 13 to the flux printing unit 3 and stops at a predetermined position. Here, the alignment marks of the wafer 14 and the printing mask 15 are individually observed by the vertical observation cameras 31, and the wafer transfer stage 12 is so positioned in the X-axis direction by the X-axis drive mechanism 40 of the transfer passage 13, in the Y-axis direction by the Y-axis drive mechanism 28 and in the θ-axis direction by the θ-axis drive mechanism 29 that the electrodes 38 of the wafer 14 and the through holes of the printing mask 15 may be centrally aligned. After positioned, the wafer transfer stage 12 is raised by the Z-axis drive mechanism 30 so that it is stopped at a predetermined height position with respect to the printing mask 15 having been prepared with the flux. In this state, the printing mask 15 is fed with the flux at its one end portion in the Y-axis direction, and the squeezee is moved toward the other end portion to print the flux on the electrodes 38 of the wafer 14 from the through holes of the printing mask 15.

After the flux-printing, the wafer transfer stage 12 is moved downward by the Z-axis drive mechanism 30 and is moved to the ball mounting unit 4 by the X-axis drive mechanism 40 so that it is stopped at a predetermined position. Here, the alignment marks of the wafer 14 and the ball array mask 19 are also individually observed by the vertical observation cameras 34, and the wafer transfer stage 12 is positioned in the X-axis direction by the X-axis drive mechanism 40 of the transfer passage 13, and in the Y-axis direction and in the θ-axis direction by the Y-axis drive mechanism and the θ-axis drive mechanism 29, respectively. After this, the wafer transfer stage 12 is moved upward by the Z-axis drive mechanism 30 so that it is stopped while leaving the predetermined clearance from the ball array mask 19.

Figure 3:
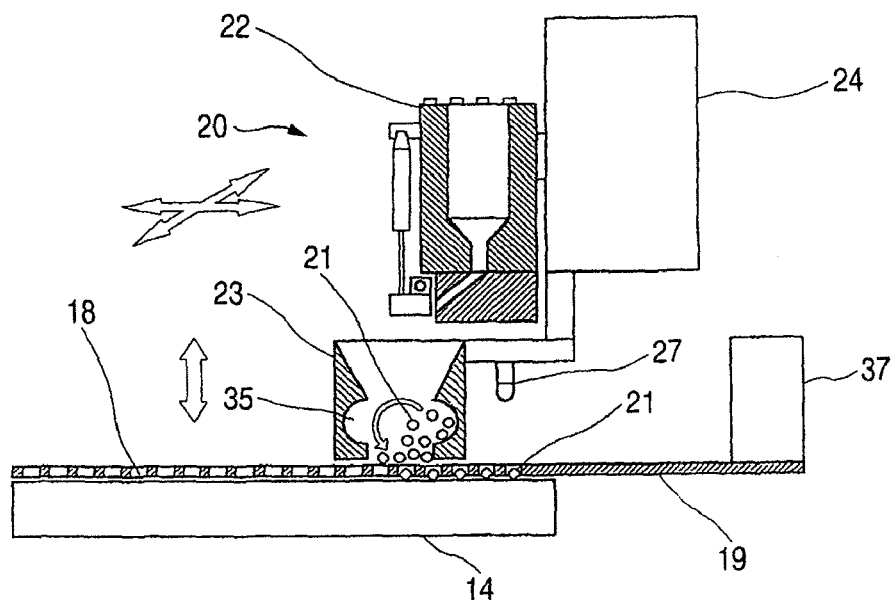
FIG. 3 is a partially sectional, explanatory side elevation showing a ball mounting unit.
Figure 4:
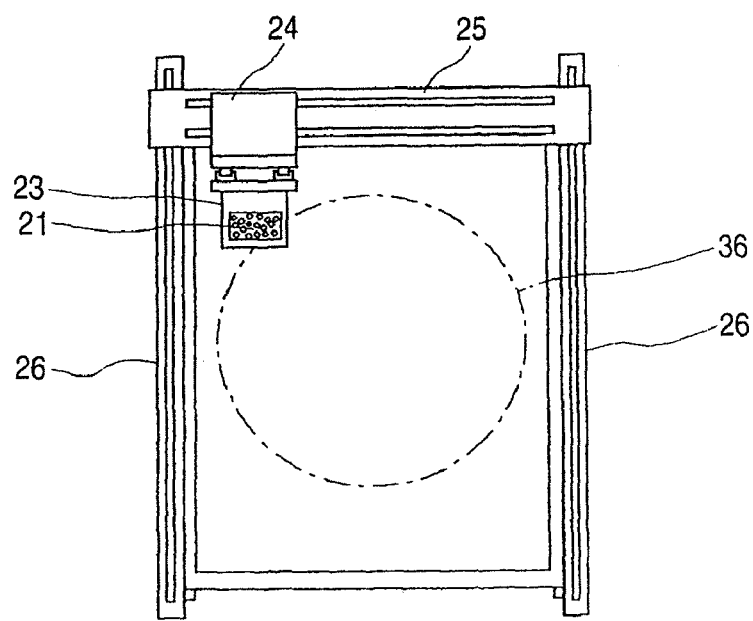
FIG. 4 is a top plan view of the ball mounting unit.

As shown in FIG. 3, the ball cup 23 moves over the ball array mask 19 to drop the solder balls 21 into the through holes 18 of the ball array mask 19 so that the solder balls 21 are mounted on the wafer 14. After this ball dropping operation, the wafer transfer stage 12 is finely moved straight (in the X-axis direction) with respect to the ball array mask 19 to correct the positions of the solder balls 21 in the through holes 18 thereby to arrange the positions of the solder balls 21. Here, it is preferred that the fine movement distance of the wafer transfer stage 12 is at least the distance of the difference between the diameter of the solder ball 21 and the diameter of the through holes 18.

Figure 5A:
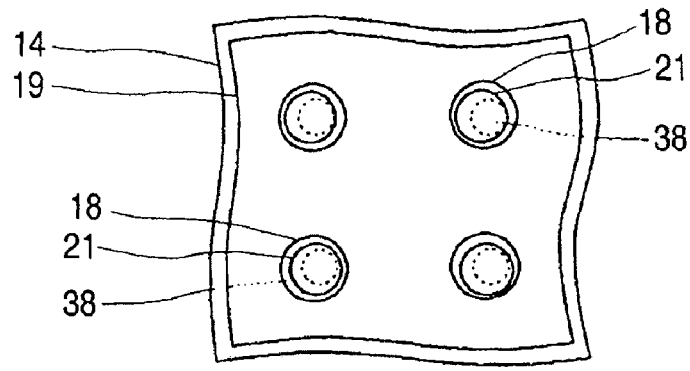
FIGS. 5A-5I are explanatory views showing a fine moving procedure of the ball array mask and the wafer transfer stage.
Figure 5A:
Figure 5B:
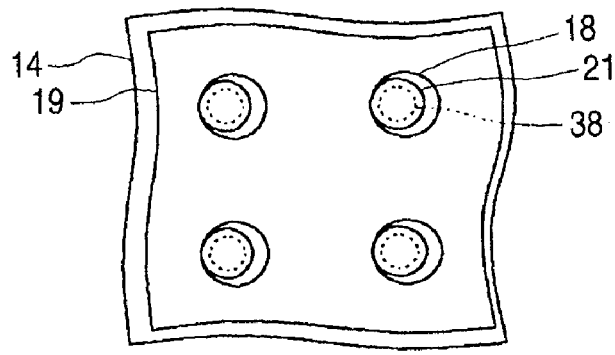
Figure 5B:
Figure 5C:
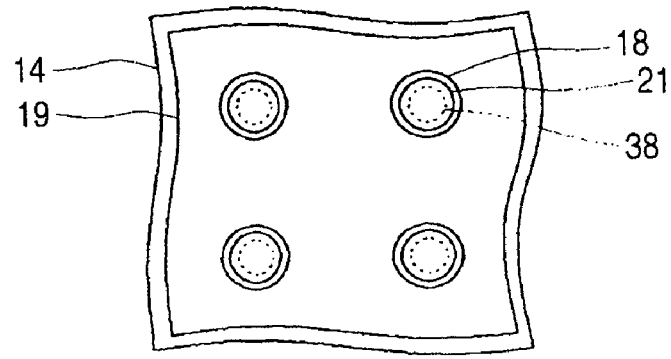

FIGS. 5A to 5C are explanatory views showing one example of a fine moving procedure of the ball array mask 19 and the wafer transfer stage 12. The centers of the electrodes 38 of the wafer 14 are so positioned that they are deviated in the X-axis direction from the centers of the through holes 18 of the ball array mask 19 by a half distance of the difference between the diameter of the solder balls 21 and the diameter of the through holes 18. At first, FIG. 5A shows the stage immediately after the solder balls 21 were dropped into the through holes 18 of the ball array mask 19. In this state, the solder balls 21 are not always mounted in the centers of the through holes 18. As shown in FIG. 5B, therefore, the wafer transfer stage 12 is finely moved in the X-axis direction (leftward of the drawing) by the distance of the difference between the diameter of the solder balls 21 and the diameter of the through holes 18. As a result of this fine movement, the solder balls 21 finely move in the X-axis direction together with the wafer transfer stage 12 thereby to come into abutment against the lefthand inner walls, as shown, of the through holes 18 so that their positions in the X-axis direction are corrected. Simultaneously with this, the solder balls 21 moved along the lefthand inner walls, as shown in FIG. 5B, of the through holes 18 so that their positions in the Y-axis direction are corrected. In short, the solder balls 21 come into the state, in which they are precisely mounted at the central portions of the electrodes 38 of the wafer 14. As shown in FIG. 5C, the wafer transfer stage 12 is moved backward of the fine movement from FIG. 5A to FIG. 5B by the distance of one half of the difference between the diameter of the solder balls 21 and the diameter of the through holes 18. Then, all the solder balls 21 in the through holes 18 leave the inner walls of the through holes 18 and are mounted in the positions homogeneous in the X-axis direction and in the Y-axis direction. As a result, the solder balls 21 can leave without any deviation from the ball array mask 19 when the wafer transfer stage 12 moves downward. Here, the fine movement distance may be longer than the difference between the diameter of the solder balls 21 and the diameter of the through holes 18, but the initial position of the wafer transfer stage 12 at the ball mounting unit is set according to that distance.

Figure 5D:
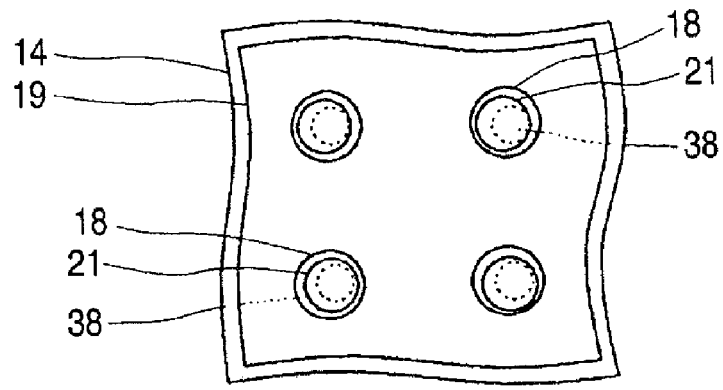
Figure 5D:
Figure 5E:
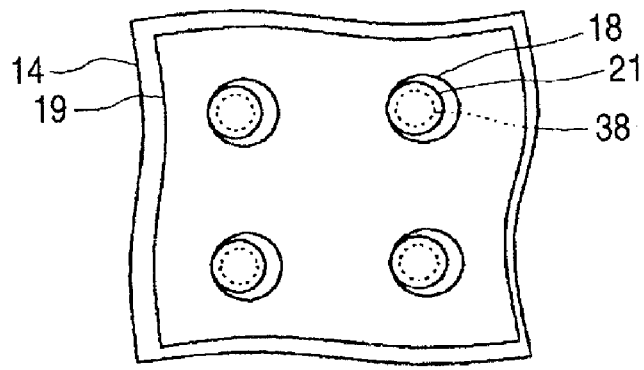
Figure 5E:
Figure 5F:
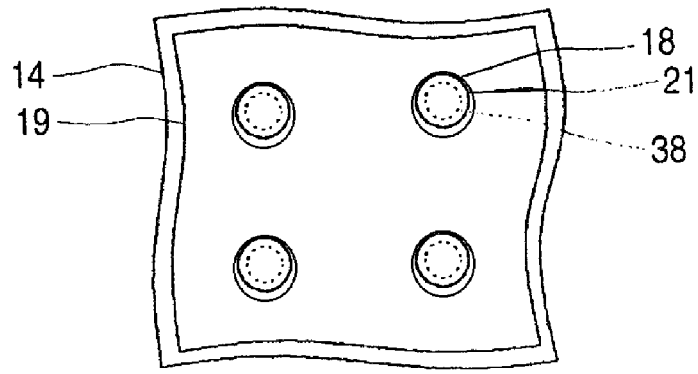
Figure 5G:
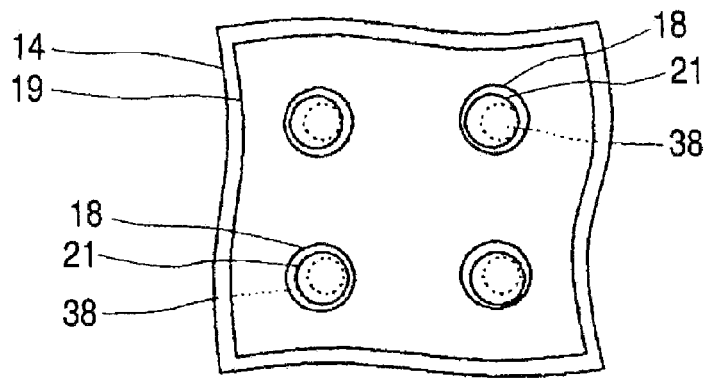
Figure 5G:
Figure 5H:
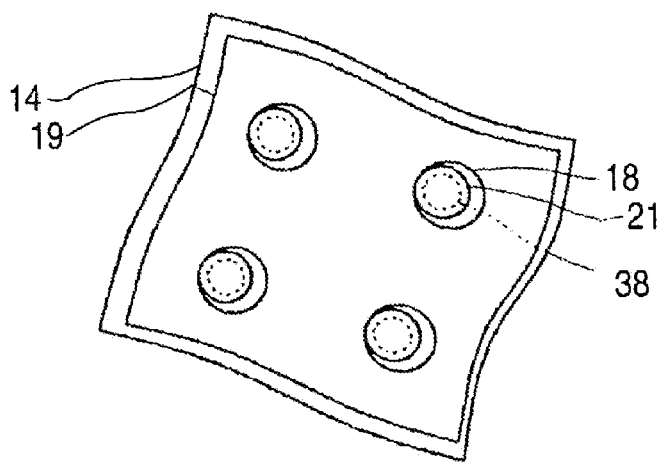
Figure 5H:
Figure 5I:
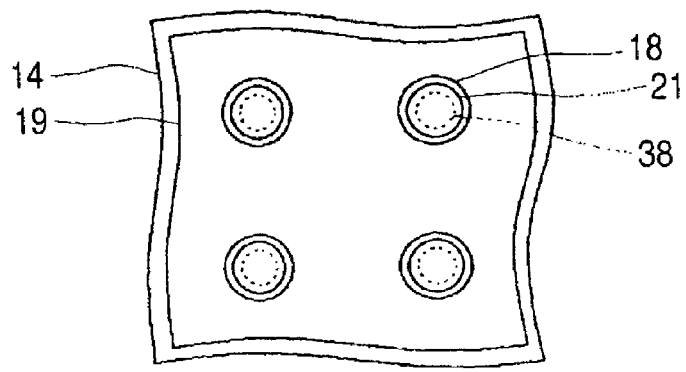
Figure 6:
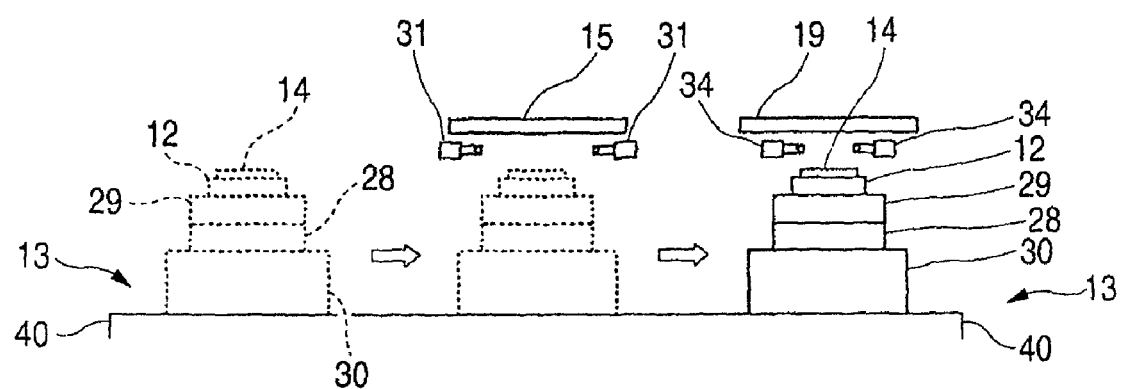
FIG. 6 is a front elevation showing the movement of a wafer transfer stage.

In the embodiment thus far described, the fine movements of the ball array mask 19 and the wafer transfer stage 12 are straight in one direction, i.e., in the X-axis direction of the horizontal directions. As illustrated in FIGS. 5D-5I, however, natural that the fine movements may be one in another direction such as in the Y-axis direction, sequential ones in two perpendicular directions in the horizontal directions, or a turning one in a horizontal plane. As illustrated in FIGS. 5D-5F in the sequential movements in the two directions perpendicular in the horizontal directions, the wafer transfer stage 12 is finely moved in the X-axis direction by a distance equal to at least the difference between the diameter of the solder balls 21 and the diameter of the through holes 18. After this, the wafer transfer stage 12 is finely moved in the Y-axis direction perpendicular to the X-axis direction by the half distance of the difference between the diameter of the solder balls 21 and the diameter of the through holes 18, and is then finely moved so that the solder balls 21 may return to the centers of the through holes 18. As illustrated in FIGS. 5G-5I, the turning motions in the horizontal plane, on the other hand, the wafer transfer stage 12 is turned with a turning radius of one half of the difference between the diameter of the solder balls 21 and the diameter of the through holes 18 and is so turned or moved straight that the solder balls 21 may finally return to the centers of the through holes 18.

In this embodiment, as the moving means for that fine movement, the fine movement in the X-axis direction is caused by the X-axis drive mechanism 40 of the transfer passage 13, and the fine movement in the Y-axis direction is caused by the Y-axis drive mechanism 28 of the wafer transfer stage 12, so that the wafer transfer stage 12 is finely moved by that moving means. Since the fine movements may be relative ones, however, the ball array mask 19 may also be provided with a moving device for moving the ball array mask 19 finely in the X-axis direction and in the Y-axis direction.

After the solder balls mounting operation, the wafer transfer stage 12 is moved downward by the Z-axis drive mechanism 30 so that it is moved to stop at the carry-out wafer transfer unit. In the wafer housing unit 10, the wafer 14 is transferred from the wafer transfer stage 12 to the inversion unit 9 by the carry-out robot 11, and the wafer 14 is turned to bring the orientation flat or notch to the predetermined position. The wafer 14 is further transferred by the carry-out robot 11 from the inversion unit 9 to the magazine 32 of the wafer housing unit 10. When the carry-out robot 11 takes out the wafer 14 from the wafer transfer stage 12, the wafer transfer stage 12 returns to the original position or the wafer transfer unit 2, thus completing one step. The present apparatus repeats the actions thus far described.

Figure 2:
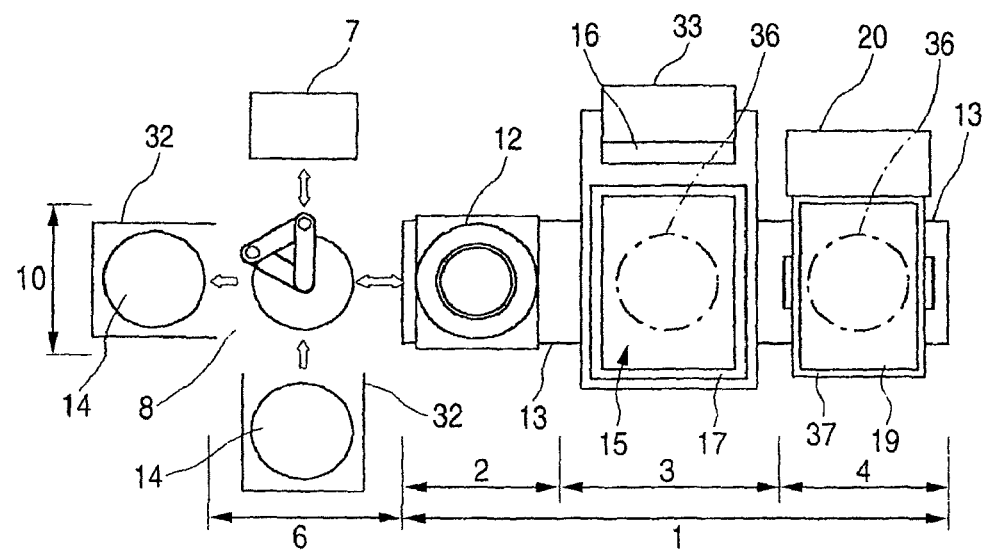
FIG. 2 is a schematic top plan view of the case, in which a wafer feeding unit and a wafer housing unit are disposed in the same direction.

In the embodiment shown in FIG. 1, the wafer feeding unit 6 is disposed in front of the solder ball mounting apparatus 1, and the wafer housing unit 10 is disposed at the back. Since the wafer transfer stage 12 returns to the original position, as described above, the wafer feeding unit 6 and the wafer housing unit 10 may also be disposed on one side, as shown in FIG. 2.

With the structure thus made, the carry-out robot 11 can be replaced by the carry-in robot 8, and the wafer 14 is held and housed in the same direction as that of the wafer 14 being carried in, so that the inversion unit 9 can be omitted. Moreover, one of the wafer transfer units 2 and 5 can also be omitted so that the number of structural components can be reduced.

Moreover, this embodiment employs the vertical observation cameras 31 and 34 for photographing the alignment marks of the wafer 14 and the printing mask 15 or the ball array mask 19 simultaneously at the stop time of the wafer transfer stage 12, as the means for positioning the printing mask 15 and the ball array mask 19, and the wafer 14. However, the invention should not be limited thereto but can be conceived to have various structures.

What is claimed is:

1. A method of mounting a conductive ball to a mounting target, the method comprising:
    applying an adhesive to an electrode on the mounting target, the mounting target mounted to a stage;
    controlling at least one of the stage and an array mask to align the electrode and adhesive with a through hole of the array mask;
    dropping the conductive ball into the through hole; and
    moving at least one of the stage and the array mask relative to each other in a horizontal direction after the conductive ball was dropped to cause the conductive ball to come into abutment against an inner wall of the through hole of the array mask to adjust a position of the conductive ball in the through hole,
    wherein the horizontal direction is a direction parallel to a plane of a surface of the mounting target on which the adhesive is applied, and
    wherein the moving at least one of the array mask and the stage further comprises a sequential movement in a direction perpendicular to the horizontal direction.

2. A method of mounting a conductive ball to a mounting target, the method comprising:
    applying an adhesive to an electrode on the mounting target, the mounting target mounted to a stage;
    controlling at least one of the stage and an array mask to align the electrode and adhesive with a through hole of the array mask;
    dropping the conductive ball into the through hole; and
    moving at least one of the stage and the array mask relative to each other in a horizontal direction after the conductive ball was dropped to adjust a position of the conductive ball in the through hole,
    wherein the moving at least one of the array mask and the stage comprises a movement to turn in a horizontal plane.

* * * * *